US009402333B2

(12) United States Patent
Li et al.

(10) Patent No.: US 9,402,333 B2
(45) Date of Patent: Jul. 26, 2016

(54) VENTILATION DENOISING DEVICE AND VENTILATION DENOISING SYSTEM

(71) Applicant: Huawei Technologies Co., Ltd., Shenzhen (CN)

(72) Inventors: Baosheng Li, Shenzhen (CN); Jun Zhao, Munich (DE); Chengpeng Yang, Shenzhen (DE); Chuangguo Gu, Shenzhen (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/636,820

(22) Filed: Mar. 3, 2015

(65) Prior Publication Data
US 2015/0181759 A1 Jun. 25, 2015

Related U.S. Application Data

(63) Continuation of application No. 14/078,014, filed on Nov. 12, 2013, now abandoned, which is a continuation of application No. PCT/CN2011/077848, filed on Aug. 1, 2011.

(51) Int. Cl.
*E04F 17/04* (2006.01)
*H05K 7/20* (2006.01)
(Continued)

(52) U.S. Cl.
CPC ............ *H05K 7/20136* (2013.01); *F24F 13/24* (2013.01); *H05K 7/20145* (2013.01); *F24F 2011/0006* (2013.01)

(58) Field of Classification Search
CPC ....... F24F 13/24; H05K 7/20; H05K 7/20136; H05K 7/20145; H05K 7/20709; H05K 7/20718

USPC .......... 181/224, 200, 201, 225; 361/695, 688, 361/694, 690; 454/184
See application file for complete search history.

(56) References Cited

U.S. PATENT DOCUMENTS 4,733,750 A * 3/1988 Poirier .................... F02B 63/04
181/202
5,299,634 A * 4/1994 Toyoda ................. F04D 29/663
165/135
(Continued)

FOREIGN PATENT DOCUMENTS

CN 2769749 Y 4/2006
CN 2859338 Y 1/2007
(Continued)

OTHER PUBLICATIONS

Office Action in corresponding U.S. Appl. No. 14/078,014 (Nov. 4, 2014).

*Primary Examiner* — Edgardo San Martin
(74) *Attorney, Agent, or Firm* — Leydig, Voit & Mayer, Ltd.

(57) ABSTRACT

A ventilation denoising device that includes at least one ventilation module disposed with at least two air ducts inside, the air ducts are communicated end-to-end to form a circuitous air duct. The ventilation module is provided with a first ventilation opening communicated with one end of the air duct, and a second ventilation opening communicated with the other end of the air duct. Also disclosed is a ventilation denoising system equipped with the above mentioned ventilation denoising device. The ventilation denoising device can be installed outside equipments, such as a machine cabinet, as ventilation means thereof, and also reduce the noise generated during the equipment operation.

11 Claims, 21 Drawing Sheets

(51) Int. Cl.
*F24F 13/24* (2006.01)
*E04F 17/00* (2006.01)
*H05K 7/00* (2006.01)
*F24F 11/00* (2006.01)

(56) References Cited

U.S. PATENT DOCUMENTS

| | | | |
|---|---|---|---|
| 5,526,228 A | 6/1996 | Dickson et al. | |
| 5,636,286 A | 6/1997 | Makabe et al. | |
| 5,931,002 A * | 8/1999 | Nagashima | H05K 7/20145 361/692 |
| 6,131,696 A * | 10/2000 | Esslinger | F04B 39/0055 181/224 |
| 6,459,578 B1 | 10/2002 | Wagner | |
| 6,719,078 B2 * | 4/2004 | Nakamura | F02M 35/10013 180/69.22 |
| 7,046,513 B2 * | 5/2006 | Nishiyama | H05K 7/20572 165/122 |
| 7,286,348 B2 * | 10/2007 | Vinson | H05K 7/20136 361/694 |
| 7,314,113 B2 * | 1/2008 | Doll | E04F 17/04 165/135 |
| 7,334,662 B1 | 2/2008 | Anderl et al. | |
| 7,379,298 B2 * | 5/2008 | Walsh | H05K 5/0213 181/198 |
| 7,379,299 B2 * | 5/2008 | Walsh | H05K 5/0213 181/198 |
| 7,382,632 B2 | 6/2008 | Alo et al. | |
| 7,646,603 B2 | 1/2010 | Bard et al. | |
| 7,724,515 B2 * | 5/2010 | Fukuda | G06F 1/182 181/206 |
| 7,727,059 B2 | 6/2010 | Merino | |
| 7,779,960 B2 | 8/2010 | Tang et al. | |
| 7,782,612 B2 | 8/2010 | Walsh et al. | |
| 7,783,055 B2 | 8/2010 | Barath et al. | |
| 7,894,613 B1 | 2/2011 | Ong et al. | |
| 7,914,366 B2 * | 3/2011 | Miyamoto | G11B 33/142 361/694 |
| 7,929,295 B2 * | 4/2011 | Joshi | F04D 25/166 181/198 |
| 7,986,526 B1 * | 7/2011 | Howard | H05K 7/1488 181/200 |
| 8,331,086 B1 * | 12/2012 | Meissner | H05K 7/20736 312/223.2 |
| 8,408,356 B2 * | 4/2013 | Yamaguchi | H05K 7/20736 181/198 |
| 8,701,821 B2 * | 4/2014 | O'Coimin | H05K 7/20736 181/224 |
| 2007/0230124 A1 | 10/2007 | Bartell et al. | |
| 2008/0186668 A1 | 8/2008 | Naufel et al. | |
| 2008/0257639 A1 | 10/2008 | Yamaguchi et al. | |
| 2009/0133957 A1 * | 5/2009 | Owens | F24F 13/24 181/224 |
| 2010/0056036 A1 | 3/2010 | Nobile | |
| 2010/0258377 A1 | 10/2010 | Cash et al. | |
| 2014/0340846 A1 * | 11/2014 | Kurita | H05K 7/20727 361/695 |
| 2015/0101883 A1 * | 4/2015 | Xu | F24F 13/082 181/224 |

FOREIGN PATENT DOCUMENTS

| | | |
|---|---|---|
| CN | 201421168 Y | 3/2010 |
| CN | 101727895 A | 6/2010 |
| CN | 101949568 A | 1/2011 |
| CN | 201852256 U | 6/2011 |
| KR | 20100062468 A | 6/2010 |
| WO | WO 02071820 A1 | 9/2002 |

\* cited by examiner

VENTILATION DENOISING DEVICE AND VENTILATION DENOISING SYSTEM

CROSS-REFERENCE TO RELATED APPLICATIONS

This application is a continuation of U.S. patent application Ser. No. 14/078,014, filed on Nov. 12, 2013, which is a continuation of International Patent Application PCT/CN2011/077848, filed on Aug. 1, 2011, both of which are hereby incorporated by reference in their entireties.

FIELD OF TECHNOLOGY

Embodiments of the present disclosure relate to ventilation denoising structures and, more particularly, to a ventilation denoising device and a ventilation denoising system.

BACKGROUND

It is fundamental to cool electronic equipments, such as cabinets, to ensure stable operation of the electronic equipments. The cooling treatment performed on an electronic equipment is to reduce the temperature of the electronic equipment, usually by driving cold air into the interior of the electronic equipment. However, the fan with which the cold air is driven generates great noise, especially in the case of an electronic equipment with relatively large amount of heat where the running speed of the fan is extremely rapid, and the noise generated thereby causes in the external environment severe influences that not only lower the working efficiency of people, but also even endanger the psychosomatic health of people in extreme cases. Accordingly, the noise generated in the running process of an electronic equipment should be reduced, to thereby reduce its influences on the external environment.

Currently, in order to reduce the noise of electronic equipments, such as cabinets, noise reduction is usually carried out inside the cabinets. Currently available cabinets are usually provided with dedicated ventilation denoising air ducts, and fans are provided at regions where the ventilation denoising air ducts are communicative with electronic components to drive cold air into the interior of the cabinets, or to drive hot air to be expelled outside of the interior of the cabinets. Noise-reducing components are provided in the ventilation denoising air ducts to reduce the noise generated during running of the electronic equipments and to reduce the noise that enters the external environment.

However, the arrangement of a dedicated noise-reducing duct inside a currently available cabinet to perform noise reduction for the cabinet is defective in the following aspects. The dedicated noise-reducing duct occupies relatively large space of the cabinet, thus affecting the installation and maintenance of electronic components inside the cabinet because the space inside the cabinet is limited. Moreover, due to the restriction in space, the noise-reducing and ventilating capabilities of the noise-reducing duct disposed in the cabinet are so restricted as to be unsuitable for performing heat dissipation and noise reduction for cabinets with great amount of heat and small volumes.

SUMMARY

Embodiments of the present disclosure provide a ventilation denoising device and a ventilation denoising system that do not occupy the internal space of an electronic equipment, enhance noise-reducing and ventilating capabilities, and meet the requirements on heat dissipation and noise reduction of different types of electronic equipments.

Embodiments of the present disclosure provide a ventilation denoising device, which is mounted external to equipment to be ventilated and noise-reduced and comprises:

at least one ventilating module that includes at least two internal air passages communicative end-to-end sequentially to form an air duct;

wherein the ventilating module is provided with a first ventilation opening and a second ventilation opening, of which the first ventilation opening is communicative with an end of the air duct, and the second ventilation opening is communicative with another end of the air duct.

Embodiments of the present disclosure provide a ventilation denoising system that comprises equipment to be ventilated and noise-reduced and a ventilation denoising device, of which the ventilation denoising device comprises:

at least one ventilating module that includes at least two air internal passages communicative end-to-end sequentially to form an air duct;

wherein the ventilating module is provided with a first ventilation opening and a second ventilation opening, of which the first ventilation opening is communicative with an end of the air duct, and the second ventilation opening is communicative with another end of the air duct; and wherein the equipment has ventilation openings thereon, the ventilation denoising device is mounted at the ventilation openings of the equipment, and the first ventilation openings of the various ventilating modules are respectively communicative with corresponding ventilation openings on the equipment.

In the ventilation denoising device and ventilation denoising system provided by the embodiments of the present disclosure, a devious air duct is obtained by providing a plurality of end-to-end communicated air passages in the noise-reducing module, whereby the ventilating module is provided with better noise-reducing capabilities, and the air duct of the ventilating module can be directly communicative with the air inlet or air outlet outside a cabinet, to thereby absorb the noise generated during running of the cabinet via the devious air duct. The ventilation denoising device provided by the embodiments is simple in structure and easy for implementation, can be directly mounted external to the cabinet, does not affect the arrangement in the internal space of the cabinet as the ventilation denoising device of the cabinet, and makes effective use of the structure of the ventilating module to carry out noise process while satisfying the ventilating requirement of the cabinet, and to reduce the influences to the external environment by the noise generated during the running process of the cabinet. The ventilation denoising device according to the embodiments can be directly mounted external to the cabinet, and this facilitates installation and maintenance of the ventilation denoising device, which is adapted to the heat-dissipating and noise-reducing requirement of different cabinets, and has good heat-dissipating and noise-reducing effects, such as for cabinets with great amount of heat and small volumes.

BRIEF DESCRIPTION OF THE DRAWINGS

To make clearer the explanation of technical solutions of the embodiments of the present disclosure, accompanying drawings needed in the description of the embodiments are briefly illustrated below. Apparently, the accompanying drawings illustrated below are merely directed to some embodiments of the present disclosure, and it is possible for persons ordinarily skilled in the art to deduce other drawings from these drawings without creative effort.

FIG. 1A is a schematic view exemplarily illustrating the structure of a ventilation denoising device provided by Embodiment 1 of the present disclosure.

DETAILED DESCRIPTION

To make clearer the objectives, technical solutions and advantages of the embodiments of the present disclosure, the technical solutions according to the embodiments of the present disclosure are clearly described below with reference to the accompanying drawings. The embodiments as described below are merely partial, rather than entire, embodiments of the present disclosure. On the basis of the embodiments of the present disclosure, all other embodiments obtainable by persons ordinarily skilled in the art without creative effort shall all fall within the protection scope of the present disclosure.

The ventilation denoising device provided by the technical solutions of the embodiments of the present disclosure is mounted external to an equipment to be ventilated and noise-reduced, and may include at least one ventilating module. Each ventilating module can be provided with at least two air passages communicative end-to-end sequentially to form a devious air duct. The ventilating module is further provided with a first ventilation opening and a second ventilation opening respectively communicative with two ends of the air duct, and the first ventilation opening and the second ventilation opening are used for respectively communicating with an air inlet or an air outlet on the equipment to be ventilated and noise-reduced, whereby cold air of the external environment enters the interior of the cabinet via the ventilating module, or hot air generated inside the cabinet is expelled out of the cabinet via the ventilating module. It is thus possible to reduce the noise generated during the running process of the cabinet by the air duct in the ventilating module, and to provide the air duct needed for ventilation.

To facilitate description of the technical solutions of the embodiments of the present disclosure, the cabinet will be taken as the equipment to be ventilated and noise-reduced in the embodiments of the present disclosure in the following to describe the technical solutions of the embodiments of the present disclosure, in which the cabinet is an electronic equipment in which an electronic component such as a circuit board can be installed. As comprehensible to persons skilled in the art, embodiments of the present disclosure are not restricted to ventilation and noise reduction of the cabinet, as they are also applicable to other equipments requiring ventilation and noise reduction. At the same time, explanations are made with respect with different embodiments according to relations of cooperation among ventilating modules in the ventilation denoising device as well as the difference in relations of cooperation with the cabinet.

Embodiment 1

Figure 1A:
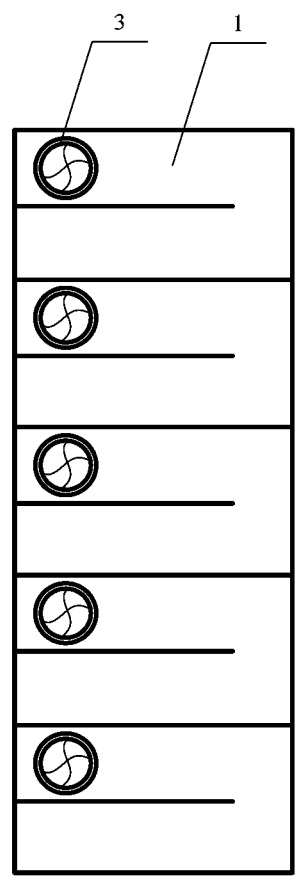
FIG. 1B is a schematic view exemplarily illustrating, in stereoscopic perspective, the structure of a ventilating module provided by the embodiments of the present disclosure.
FIG. 1C is a schematic view exemplarily illustrating the sectional structure of the ventilating module in FIG. 1B.
FIG. 1D is a schematic view exemplarily illustrating the structure of a bracket in the embodiments of the present disclosure.
Figure 1B:
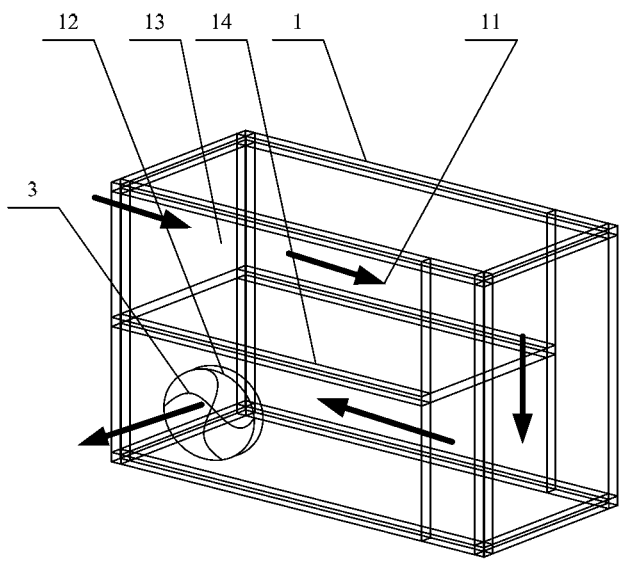
Figure 1C:
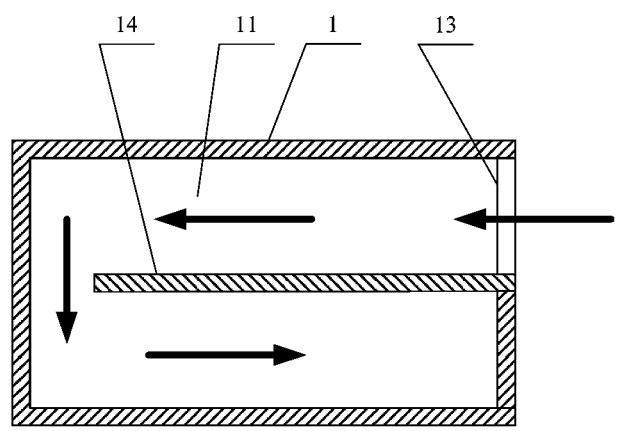

FIG. 1A is a schematic view exemplarily illustrating the structure of a ventilation denoising device provided by Embodiment 1 of the present disclosure, FIG. 1B is a schematic view exemplarily illustrating, in stereoscopic perspective, the structure of a ventilating module provided by the embodiments of the present disclosure, and FIG. 1C is a schematic view exemplarily illustrating the sectional structure of the ventilating module in FIG. 1B. As shown in FIGS. 1A, 1B and 1C, the ventilation denoising device according to this embodiment includes at least one ventilating module 1 internally provided with at least two air passages 11 communicative end-to-end sequentially to form a devious air duct; the ventilating module 1 is further provided with a first ventilation opening 12 and a second ventilation opening 13, of which the first ventilation opening 12 is communicative with an end of the air duct, and the second ventilation opening 13 is communicative with another end of the air duct. The ventilation denoising device according to this embodiment can be mounted at a ventilation opening outside the cabinet, serves as an air inlet device or an air outlet device of the cabinet, reduces the noise generated in the running process of the cabinet, absorbs the noise generated in the running process of the cabinet, and reduces the influences of the noise generated during the running process of the cabinet to the external environment.

In this embodiment, there may be one or more ventilating modules 1. In practical application, it is possible to provide an adequate number of the ventilating module(s) 1 according to the amount of air of the cabinet to be ventilated and the noise-reducing requirement, and to stack a plurality of ventilating modules 1 one upon another to be mounted at air inlets or air outlets outside the cabinet as air inlet or air outlet devices of the cabinet. The ventilation denoising device according to this embodiment is applicable to ventilation and noise reduction of cabinets in which air inlets and air outlets are respectively disposed at different sides. Detailed explanation is made below for applications of this embodiment in the ventilation denoising system.

In this embodiment, the air duct in the ventilating module 1 is a devious air duct formed by a plurality of air passages 11 communicating end-to-end with one another. The devious air duct in this context is a spirally structured air duct formed by a plurality of air passages. The devious air duct can also be referred to as an air duct of the labyrinthine structure, whose length is relatively long, and the duct is not a straight duct. The air duct of the labyrinthine structure can effectively reduce noise propagating therein, thus providing the ventilating module 1 with relatively strong noise-reducing capabilities. In practical application, the plurality of air passages 11 are arranged parallel to one another, and these plural passages arranged in parallel to one another are communicative end-to-end with one another to form the spirally structured devious air duct.

In this embodiment, the air duct of the labyrinthine structure can be formed by two or more air passages communicating with one another, and it is possible in practical application to provide an adequate number of air passages according to the noise-reducing requirement, so as to obtain an air duct with proper length and to enhance the noise-reducing capabilities of the ventilating module.

When the ventilation denoising device according to this embodiment is mounted at the air inlet and the air outlet of the cabinet, the noise generated during the running process of the cabinet enters the air duct of the ventilating module 1 via the first ventilation opening 12 that is respectively communicative with the air inlet and the air outlet of the cabinet, and the air duct of the labyrinthine structure in the ventilating module 1 can reduce the incoming noise so that the noise expelled from the second ventilation opening 13 of the ventilating module 1 is reduced, whereby it is possible to reduce the influences of the noise generated in the running process of the cabinet to the external environment.

In this embodiment, in order to enhance the noise-reducing capabilities of the ventilating module, it is also possible to provide a noise-reducing component in the air duct. For instance, it is possible to provide an active noise-reducing component in the air duct or provide a lining of acoustic material on the inner wall of the air duct, so as to absorb the noise coming into the air duct via the active noise-reducing component or the acoustic material. The active noise-reducing component may be an active noise-reducing system including a microphone and a loudspeaker. In one embodiment, the active noise-reducing system may include a controller, a microphone and a loudspeaker, of which the controller can collect noise signals in the air duct through the microphone, and control the loudspeaker, according to the collected noise signals, to generate a sound that is reverse in phase to the collected noise signals, so as to superimpose with the noise in the air duct and to reduce the strength of the noise in the air duct. The lining of acoustic material may be a lining with a sound absorption structure, such as a Helmholtz resonator, a perforated panel sound absorption structure, a sheet resonance sound absorption structure, and a lining formed of a pliable material, etc. Alternatively, the lining of acoustic material may also be a lining formed of a porous sound-absorbing material, including, for example, such foams as polyurethane foam and melamine foam, as well as such fibers as polyester fibers and centrifugal glass-wools.

In this embodiment, as shown in FIGS. 1B and 1C, the ventilating module 1 may be of a rectangular structure having a cavity, in which is disposed a baffle plate 14 for segmenting the cavity into at least two air passages 11 communicative end-to-end sequentially. By the use of such a rectangular structure, when the plurality of air passages communicative end-to-end with one another are obtained via the mode of providing a baffle plate, the baffle plate can be fixed inside the ventilating module 1 by the mode of insertion, whereby the ventilating module 1 is advantageous in terms of simple fabrication and relatively low cost.

In practical application, the ventilating module may also be configured as other proper shape or structure according to the scenarios of application or other requirements, so as to meet the requirement for being mounted on a cabinet. The air duct in the ventilating module may also be configured as circular, or any other shapes, as long as an air duct of a labyrinthine structure could be formed in the ventilating module to meet the requirement for reducing the noise of the cabinet.

In this embodiment, the first ventilation opening 12 on the ventilating module 1 can be configured to communicate with the air inlet or the air outlet of the cabinet, so as to take the air duct as a path through which cold air enters the cabinet or as a path through which hot air is expelled from the cabinet. In practical application, it is possible to base on the installation requirement to dispose the first ventilation opening 12 and the second ventilation opening 13 at proper positions of the ventilating module 1. In this embodiment, the two ends of the air duct in the ventilating module 1 are located at the same end of the ventilating module 1, the first ventilation opening 12 is located on a lateral face of the ventilating module 1 close to the end, and the second ventilation opening 13 is located on an end face of the ventilating module 1, so as to be mounted to the cabinet.

In this embodiment, the ventilating module 1 can be directly mounted on the cabinet, or mounted on the cabinet via other modes, by a bracket, for instance. Preferably, the ventilation denoising device in this embodiment may further include a bracket, on which the ventilating module 1 is mounted, whereby the bracket can be made use of to fix the entire ventilation denoising device onto the cabinet.

Figure 1D:

FIG. 1D is a schematic view exemplarily illustrating the structure of a bracket in the embodiments of the present disclosure. As shown in FIG. 1D, to facilitate installation of the various ventilating modules, mounting cavities 21 that are individually set to accommodate each of the ventilating modules are disposed on the bracket 2 so that the various ventilating modules can be detachably mounted in the corresponding mounting cavities 21. Thus, when partial ventilating modules are damaged, it is possible to directly take out the damaged ventilating modules for replacement or maintenance, during which process normal operation of other modules is not affected, thereby facilitating assembly and maintenance of the ventilation denoising device. The bracket 2 can be mounted on the cabinet via such fixedly connecting modes, such as via a bolt. After the bracket 2 is mounted to the cabinet, the first ventilation opening of each ventilating module can be communicative with a corresponding air inlet or a ventilation opening.

In practical application, the first ventilation opening and the second ventilation opening of the ventilating module 1 can be properly positioned according to the positions of the ventilation openings disposed on the cabinet and the environment outside the cabinet, such as the position of the region where hot air is expelled or the position of the region where cold air is supplied. In this embodiment, the first ventilation opening and the second ventilation opening of the ventilating module 1 are located at the same end as the ventilating module 1, and are disposed on different lateral faces, so as to adapt to the ventilation denoising requirements of various cabinets.

By virtue of the ventilation denoising device provided by this embodiment, a devious air duct is obtained by communicating a plurality of air passages end-to-end sequentially inside the noise-reducing module, whereby the ventilating module is provided with better noise-reducing capabilities, and the air duct of the ventilating module can be directly communicative with the air inlet or the air outlet outside a cabinet, to thereby absorb the noise generated during running of the cabinet via the devious air duct. The ventilation denoising device provided by this embodiment is simple in structure and easy for implementation, can be directly mounted external to the cabinet, does not affect the arrangement in the internal space of the cabinet, and makes effective use of the air duct structure of the ventilating module to carry out noise reduction while satisfying the ventilating requirement of the cabinet, and to reduce the influences to the external environment by the noise generated during the running process of the cabinet. The ventilation denoising device according to this embodiment is directly mounted external to the cabinet, and this facilitates installation and maintenance of the ventilation denoising device.

Embodiment 2

Figure 2A:
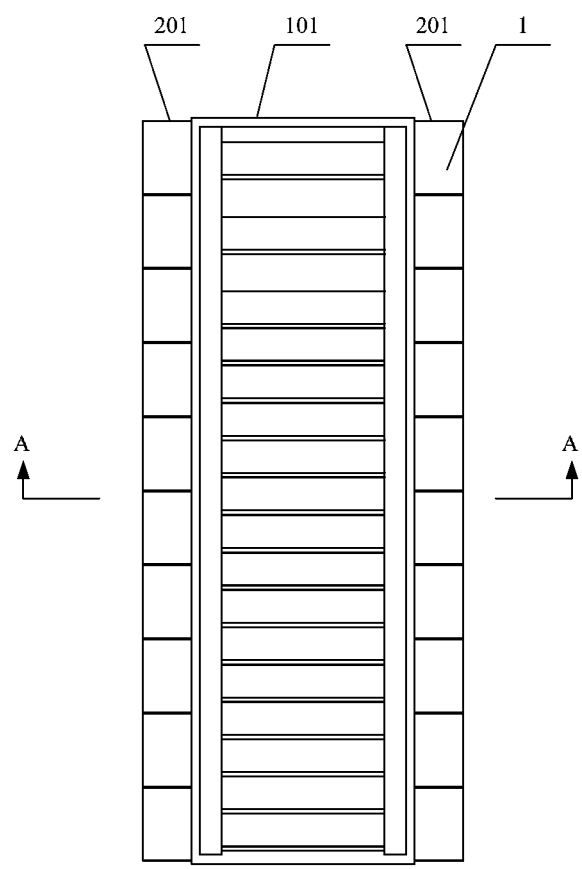
FIG. 2A is a main view illustrating a ventilation denoising system provided by Embodiment 2 of the present disclosure.
Figure 2B:
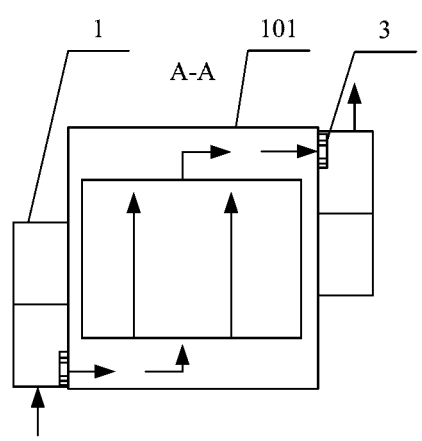
FIG. 2B is a schematic view illustrating the direction A-A in FIG. 2A.

FIG. 2A is a main view illustrating a ventilation denoising system provided by Embodiment 2 of the present disclosure, and FIG. 2B is a sectional view exemplarily illustrating the direction A-A in FIG. 2A. The ventilation denoising system according to this embodiment includes a cabinet, at whose ventilation openings are disposed ventilation denoising devices of the structure shown in FIGS. 1A-1D. As shown in FIGS. 2A and 2B, in the ventilation denoising system according to this embodiment, ventilating openings of the cabinet 101 include an air inlet and an air outlet respectively disposed at two sides of the cabinet 101, and ventilation denoising devices 201 are respectively disposed at the air inlet and the air outlet of the cabinet 101. The ventilation denoising devices 201 are of the structure shown in FIG. 1A, and first ventilation openings of ventilating modules 1 in the ventilation denoising devices 201 are respectively communicative with the air inlet and the air outlet of the cabinet 101.

In this embodiment, when the cabinet operates, external cold air enters the cabinet 101 via the ventilation denoising device 201 disposed at the air inlet, and hot air formed in the cabinet 101 after heat exchange is expelled from the ventilation denoising device 201 disposed at the air outlet—the flowing directions of the air are indicated by the arrows shown in FIGS. 2A and 2B. At the same time, the noise generated in the process enters the air ducts of the ventilating modules 1 of the ventilation denoising devices 201, whereby it is possible to use the air ducts of the ventilating modules 1 to reduce the noise, and to reduce the influences to the external environment by the noise generated during the running process of the cabinet.

In this embodiment, in order to ensure cold/hot isolation during operation of the cabinet, namely to isolate the region of the external cold air coming in the cabinet from the region of hot air expelled out of the cabinet, the second ventilation opening of the ventilating module 1 within the ventilation denoising device 201 disposed at the air inlet is located at a different end of the cabinet, as the air flowing directions indicated by the arrows shown in FIG. 2B.

In this embodiment, in order that noise generated in the running process of the cabinet enters the air ducts of the various ventilating modules 1, the cabinet should be hermetically configured, and the housing of the cabinet should have relatively strong sound-insulating effect. Thus, the noise would enter the external environment via the air ducts of the various ventilating modules 1, while the noise would become extremely small after noise reduction through the air ducts of the various ventilating modules 1, whereby it is possible to effectively reduce the influences of the noise to the external environment during the running process of the cabinet, and to enhance the noise-reducing effect of the cabinet.

The larger the number of ventilating modules 1, the better the noise-reducing effect to the noise generated during the running process of the cabinet. In practical application, it is possible to install ventilation denoising devices having a proper number of ventilating modules according to the amount of air to be ventilated (namely the cooling requirement) and the magnitude of the noise generated during the running process of the cabinet, so as to meet the ventilating and noise-reducing requirement of the cabinet.

In this embodiment, the various ventilating modules of the ventilation denoising devices can be disposed by being stacked one on the other, and communicative with the various ventilation openings disposed on the cabinet, whereby the entire ventilation denoising system has better ventilation denoising capabilities, and the ventilating modules arranged in a stacked manner are simple in structure and easy for implementation.

In another embodiment, it is also possible to provide a ventilation denoising device only at one side of the equipment according to practical noise-reducing and ventilating requirements, for instance in the case the noise generated by the cabinet is relatively small, it suffices to provide a ventilation denoising device at the air inlet of the cabinet.

Embodiment 3

Figure 3A:
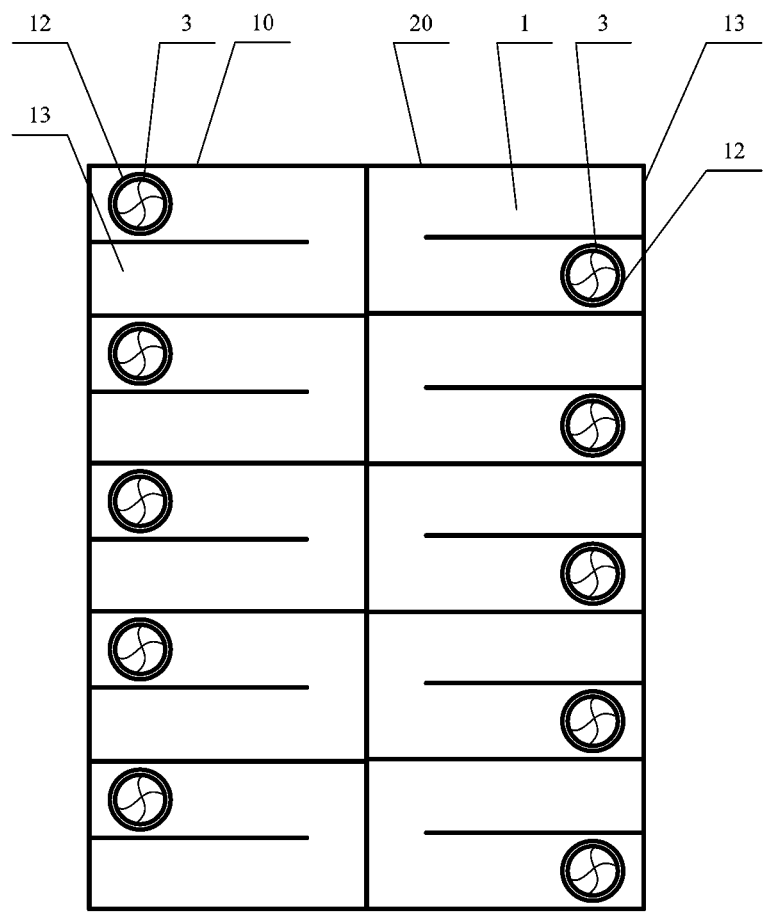
FIG. 3A is a main view illustrating a ventilation denoising device provided by Embodiment 3 of the present disclosure.
Figure 3B:
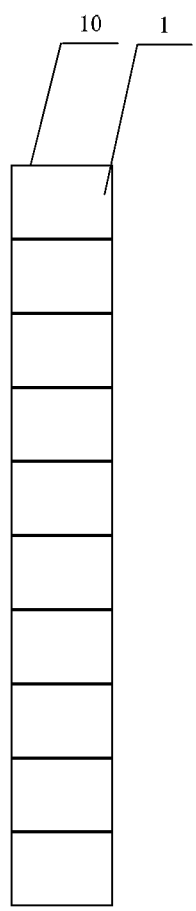
FIG. 3B is a left side view of FIG. 3A.

FIG. 3A is a main view illustrating a ventilation denoising device provided by Embodiment 3 of the present disclosure, and FIG. 3B is a left side view of FIG. 3A. Differing from the embodiment shown in FIG. 1A, the ventilation denoising device according to this embodiment includes an air inlet modular set and an air outlet modular set applicable for ventilation and noise reduction of a cabinet whose air inlet and air outlet are disposed at the same side. As shown in FIGS. 3A and 3B, there are at least two ventilating modules 1 in the ventilation denoising device according to this embodiment, including symmetrically disposed air inlet modular set 10 and air outlet modular set 20, herein the first ventilation opening 12 of the ventilating module 1 in the air inlet modular set 10 and the first ventilation opening 12 of the ventilating module 1 in the air outlet modular set 20 are disposed at the same side, and are respectively communicative with the air inlet and the air outlet disposed at the same side of the cabinet; the second ventilation opening 13 of the ventilating module 1 in the air inlet modular set 10 is located at a first end of the ventilation denoising device, such as the left side direction shown in FIG. 3A, the second ventilation opening 13 of the ventilating module 1 in the air outlet modular set 20 is located at a second end of the ventilation denoising device, such as the right side direction shown in FIG. 3A, and the first and second ends are at different sides. The ventilating module 1 in this embodiment can be of the structure shown in FIGS. 1B and 1C.

In this embodiment, the ventilation denoising device includes symmetrically disposed air inlet modular set 10 and air outlet modular set 20, which are adapted to the requirement for noise reduction of a cabinet whose air inlet and air outlet are disposed at the same side. The ventilation denoising device is mounted at one side where the ventilation opening of the cabinet locates, and the first ventilation openings 12 of the ventilating modules 1 in the air inlet modular set 10 and the air outlet modular set 20 are respectively communicative with the air inlet and the air outlet of the cabinet, so as to take the air inlet modular set 10 as the air inlet device of the cabinet and to take the air outlet modular set 20 as the air outlet device of the cabinet. Moreover, the second ventilation openings 13 of the ventilating modules 1 in the air inlet modular set 10 and the air outlet modular set 20 are respectively located at the two ends of the cabinet, whereby cold air at the cold air region outside the cabinet enters the cabinet via the second ventilation opening of the ventilating module in the air inlet modular set 10, hot air in the cabinet is expelled out of the cabinet from the second ventilation opening of the ventilating module in the air inlet modular set 102 and enters the hot air region outside the cabinet, and the cold air region and the hot air region at the outside are isolated from each other, thereby effectively meeting the requirement for circulation of external air during actual installation of the cabinet.

When the ventilation denoising device according to this embodiment is mounted to one side of the cabinet, the noise generated during the running process of the cabinet enters the ventilating modules of the air inlet modular set 10 and the air outlet modular set 20 via the air inlet and the air outlet, respectively, whereby it is possible to make use of the air ducts of the labyrinthine structure in the various ventilating modules to reduce the noise generated during the running process of the cabinet, and to reduce the influences of the noise generated during the running process of the cabinet to the external environment.

The ventilation denoising device according to this embodiment is adapted to the noise-reducing requirement of a cabinet whose air inlet and air outlet are disposed at the same side, can be directly mounted at the side of the cabinet where the ventilation opening is disposed, reduces the influences of the noise generated during the running process of the cabinet to the external environment, and is adapted to ventilation and noise reduction of a cabinet whose air inlet and ventilation opening are disposed at the same side.

Embodiment 4

Figure 4A:
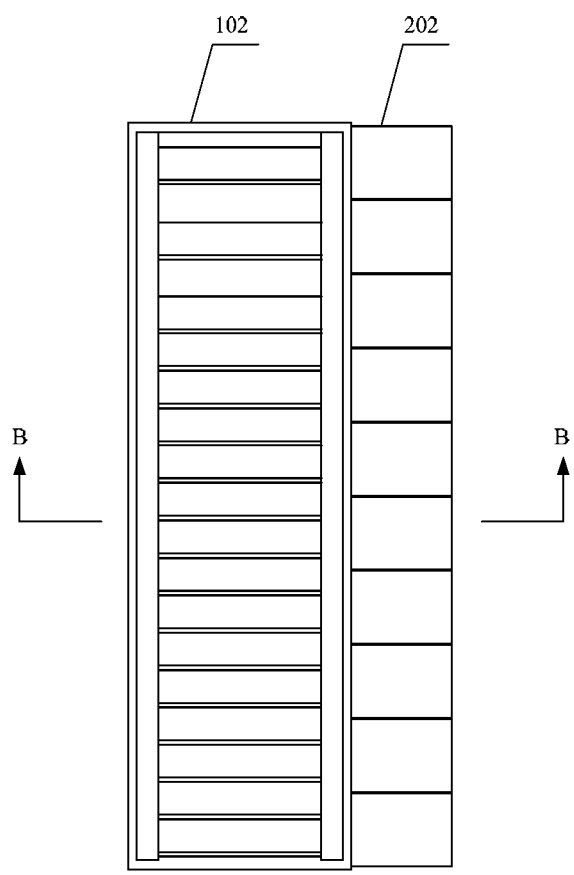
FIG. 4A is a main view illustrating a ventilation denoising system provided by Embodiment 4 of the present disclosure.
Figure 4B:
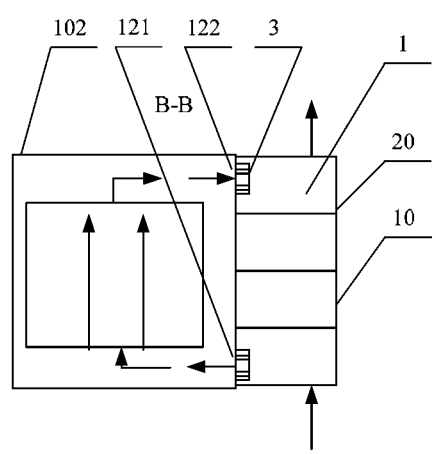
FIG. 4B is a schematic view illustrating the direction B-B in FIG. 4A.

FIG. 4A is a main view illustrating a ventilation denoising system provided by Embodiment 4 of the present disclosure, and FIG. 4B is a schematic view illustrating the direction B-B in FIG. 4A. Different from the cabinet in the system shown in FIGS. 2A and 2B, ventilation openings of the cabinet according to this embodiment are disposed at the same side of the cabinet. A ventilation denoising device of the structure shown in FIGS. 3A and 3B can be disposed at the ventilation openings of the cabinet. As shown in FIGS. 4A and 4B, at the same side of the cabinet 102 in the ventilation denoising system according to this embodiment, namely at the right side shown in FIG. 4A, are disposed an air inlet and an air outlet serving as ventilation openings, herein the air inlet and the air outlet are disposed symmetrically front-to-rear with respect to each other. At the left side of the cabinet 102 is disposed a ventilation denoising device 202 of the structure shown in FIGS. 3A and 3B, herein an air inlet modular set 10 in the ventilation denoising device 202 is located at the air inlet 121, an air outlet modular set 20 is located at the air outlet 122, the first ventilation opening of the ventilating module 1 in the air inlet modular set 10 is communicative with the air inlet 121, and the first ventilation opening of the ventilating module 1 in the air outlet modular set 20 is communicative with the air outlet 122.

In this embodiment, when the cabinet operates, cold air outside the cabinet 102 enters the cabinet 102 via the first ventilation opening of the ventilating module 1 in the air inlet modular set 10, and becomes hot air in the cabinet 102 after heat exchange to be expelled from the first ventilation opening of the ventilating module 1 in the air outlet modular set 20—the flowing directions of the air are indicated by the arrows shown in FIG. 4B. The noise generated in the running process of the cabinet enters the air ducts of the various ventilating modules 1, and enters the external environment after noise reduction by the various ventilating modules 1, whereby the noise entering the external environment is reduced.

In this embodiment, since the second ventilation openings in the air inlet modular set 10 and the air outlet modular set 20 are located at different ends, the front end and the rear end of the cabinet 102 are respectively the cold air region and the hot air region during the running process of the cabinet, and the cold air region is isolated from the hot air region to facilitate circulation of external air without interference of the cold air region and the hot air region with each other.

In this embodiment, the arrangement of the ventilation denoising device at one side of the cabinet makes it possible to effectively reduce the noise generated during the running process of the cabinet, and to reduce the influences of the noise to the external environment; moreover, the arrangement of the ventilation denoising device at one side of the cabinet facilitates installation and maintenance of the ventilation denoising device.

Embodiment 5

Figure 5:
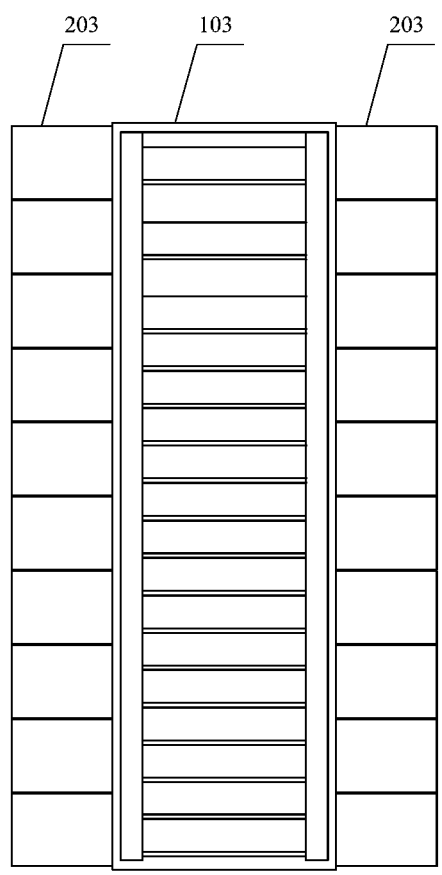
FIG. 5 is a main view illustrating a ventilation denoising system provided by Embodiment 5 of the present disclosure.

FIG. 5 is a main view illustrating a ventilation denoising system provided by Embodiment 5 of the present disclosure. Different from the system embodiment shown in FIGS. 4A and 4B, ventilation denoising devices of the structure shown in FIGS. 3A and 3B are respectively disposed at both sides of the cabinet in this embodiment. As shown in FIG. 5, ventilation openings are respectively disposed at both sides of the cabinet 103, and each includes an air inlet and an air outlet disposed at the front and the rear. Ventilation denoising devices 203 of the structure shown in FIGS. 3A and 3B are respectively disposed at both sides of the cabinet 103.

In this embodiment, cold air from the environment external to the cabinet enters the cabinet from the air inlet modular sets at both sides, hot air formed after heat exchange is expelled from the air outlet modular sets at both sides, and there are many air inlet and outlet passages to satisfy the requirement of large amount of air to be ventilated in the cabinet. At the same time, the noise generated during the running process of the cabinet also enters the various ventilating modules disposed at the two sides, to facilitate noise reduction by means of the various ventilating modules. Since at both sides of the cabinet are disposed ventilating modules, the system is provided with better noise-reducing and ventilation processing capabilities to reduce the influences of the noise generated during the running process of the cabinet to the external environment.

In this embodiment, the arrangement of ventilation denoising devices having both air inlet function and air outlet function at both sides of the cabinet can effectively ensure the amount of air to be ventilated in the cabinet, and is adapted to the use for heat dissipation of a cabinet with great demand for heat dissipation. At the same time, the noise generated during the running process of the cabinet can be reduced, and influences of the noise generated during the running process of the cabinet to the external environment can be reduced.

Embodiment 6

Figure 6A:
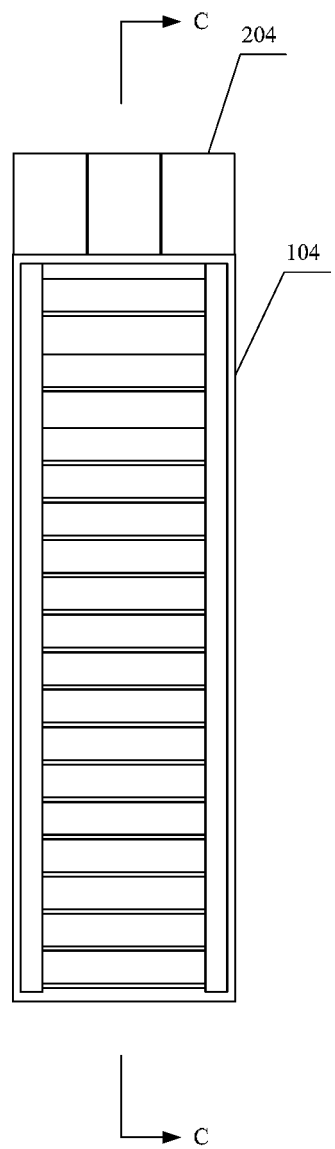
FIG. 6A is a main view illustrating a ventilation denoising system provided by Embodiment 6 of the present disclosure.
Figure 6B:
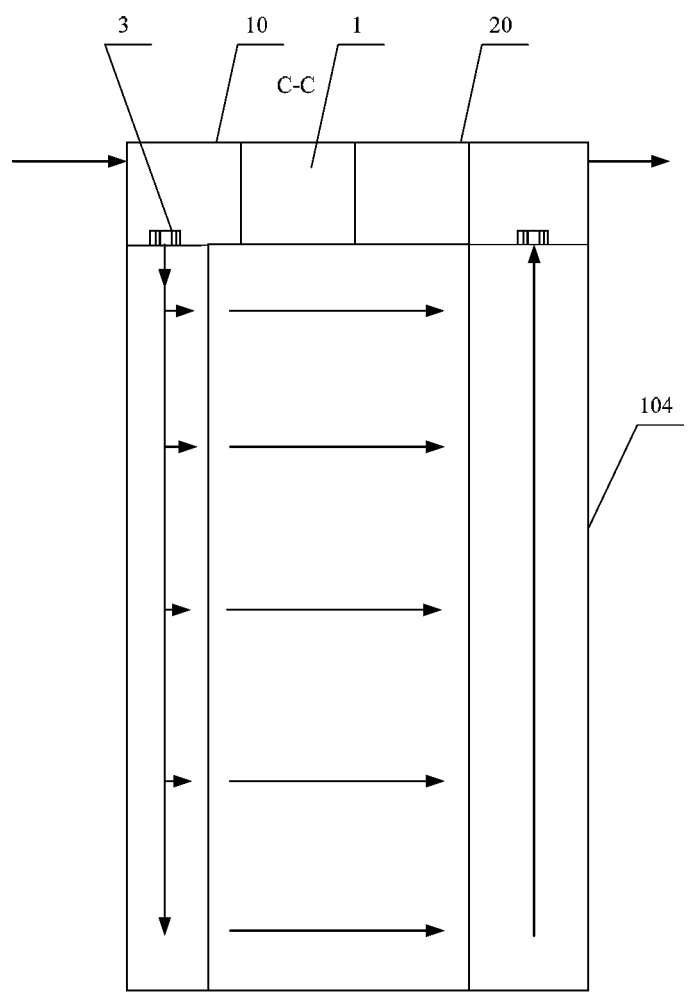
FIG. 6B is a schematic view illustrating the direction C-C in FIG. 6A.

FIG. 6A is a main view illustrating a ventilation denoising system provided by Embodiment 6 of the present disclosure, and FIG. 6B is a schematic view illustrating the direction C-C in FIG. 6A. Different from the system embodiment shown in FIGS. 4A and 4B, a ventilation denoising device of the structure shown in FIGS. 3A and 3B can be disposed on the top of the cabinet in this embodiment. As shown in FIGS. 6A and 6B, ventilation openings including an air inlet and an air outlet are disposed on the top of the cabinet 104, and the air inlet and the air outlet are symmetrically disposed at the left and right sides. A ventilation denoising device 204 of the structure shown in FIGS. 3A and 3B is disposed at the ventilation openings on the top of the cabinet 104.

In this embodiment, the ventilation denoising device disposed on the top of the cabinet makes it possible for external cold air to enter the cabinet via the air inlet modular set of the ventilation denoising device, and for hot air formed after heat exchange to be expelled out of the cabinet via the air outlet modular set of the ventilation denoising device, thus cooling the cabinet—the air flowing directions are indicated by the arrows shown in FIG. 6B. At the same time, the noise generated during the running process of the cabinet enters the air ducts of the various ventilating modules of the ventilation denoising device, whereby it is possible to use the various ventilation denoising modules to reduce the noise, and reduce the influences of the noise generated during the running process of the cabinet to the external environment.

Embodiment 7

Figure 7A:
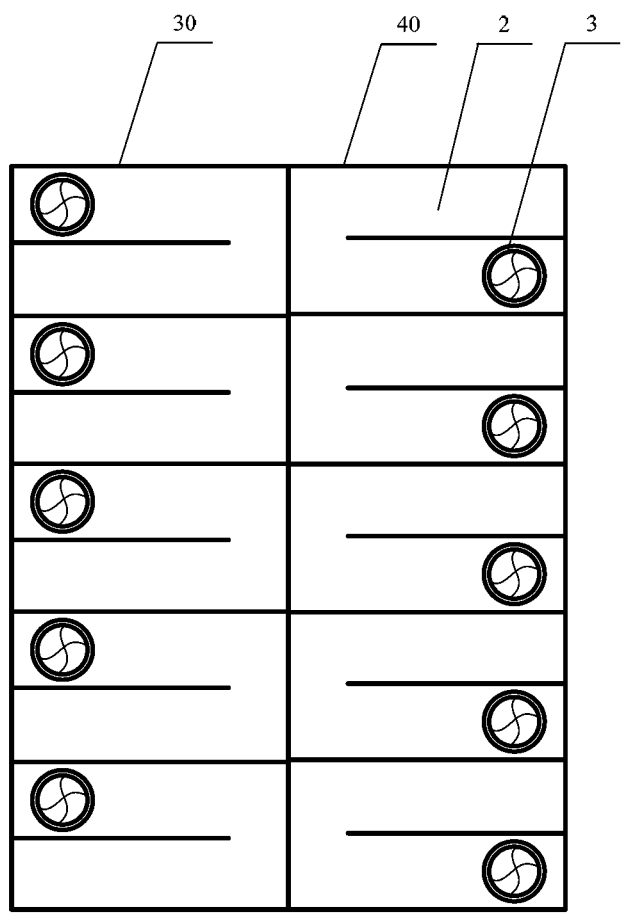
FIG. 7A is a main view illustrating a ventilation denoising device provided by Embodiment 7 of the present disclosure.
Figure 7B:
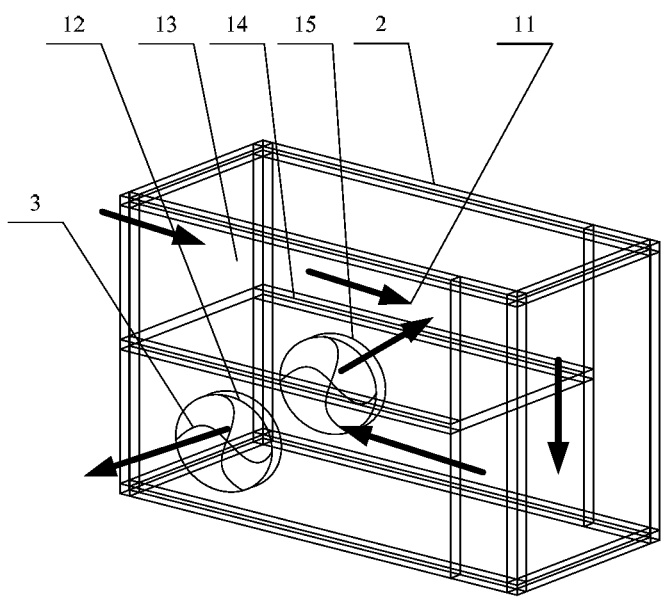
FIG. 7B is a schematic view exemplarily illustrating, in stereoscopic perspective, the structure of a ventilating module in FIG. 7A.

FIG. 7A is a main view illustrating a ventilation denoising device provided by Embodiment 7 of the present disclosure, and FIG. 7B is a schematic view exemplarily illustrating, in stereoscopic perspective, the structure of a ventilating module in FIG. 7A. Different from the device embodiment shown in FIGS. 3A and 3B, the ventilating module of the ventilation denoising device in this embodiment can have two second ventilation openings communicative with cabinets, whereby it is possible to mount the ventilation denoising device between two cabinets to achieve ventilation and noise reduction of the two cabinets. As shown in FIGS. 7A and 7B, on the basis of the ventilating module shown in FIGS. 1B and 1C, the ventilating modules 2 of the air inlet modular set 30 and the air outlet modular set 40 in this embodiment are each provided with a third ventilation opening 15 for communicating with the ventilation opening on the cabinet, and it is thus possible for the first ventilation opening 12 and the third ventilation opening 15 of the ventilating module 2 to be respectively communicative with ventilation openings of two cabinets disposed opposite each other, so that the ventilation denoising device according to this embodiment can be mounted between two cabinets disposed opposite each other and communicative with ventilation openings of the two cabinets, and the air inlet modular set 30 and the air outlet modular set 40 in the ventilation denoising device can be used respectively as the air inlet and air outlet devices of the two cabinets.

In this embodiment, the first ventilation opening 12 and the third ventilation opening 15 are disposed symmetrically with respect to each other, so as to facilitate communication with air inlets or air outlets of the two symmetrically disposed cabinets, and to facilitate installation of the ventilation denoising device. The positions of the first ventilation opening 12 and the third ventilation opening 15 can be set according to the positions of the ventilation openings of the two cabinets to be communicative with, and can be set on demand in practical application.

The ventilating module of the ventilation denoising device according to this embodiment has two ventilation openings communicative with ventilation openings of cabinets, can be used in two symmetrically disposed cabinets, can simultaneously serve as the air inlet and air outlet devices of the two cabinets, reduces the noise generated during the running process of the cabinets, and is applicable to ventilation and noise reduction of cabinets with less demand for heat dissipation and having relatively small noise.

Embodiment 8

Figure 8A:
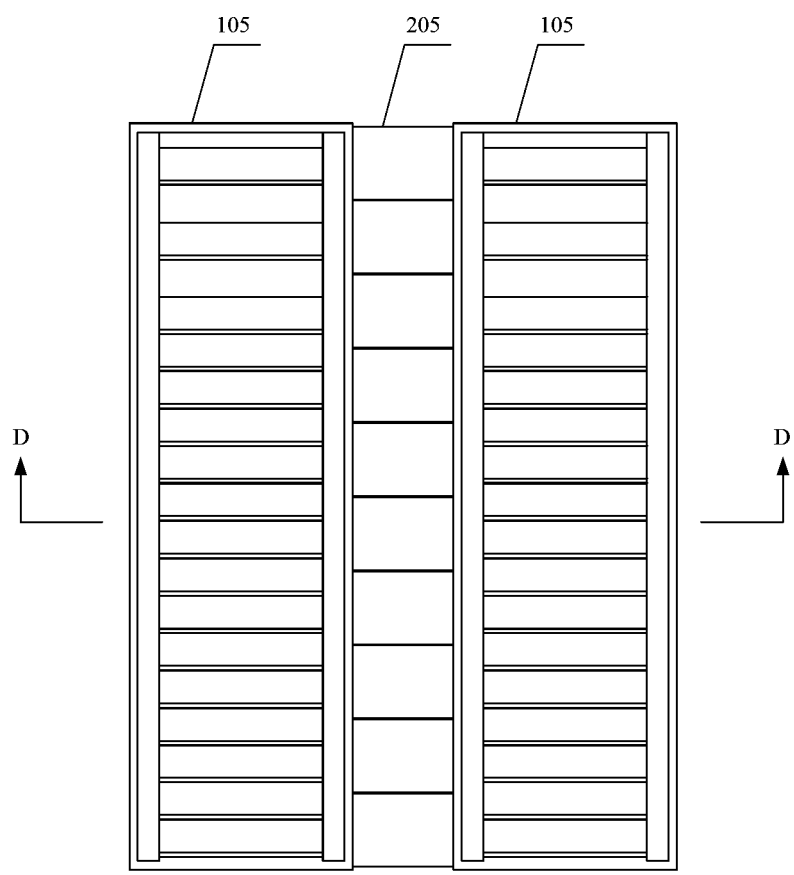
FIG. 8A is a main view illustrating a ventilation denoising system provided by Embodiment 8 of the present disclosure.
Figure 8B:
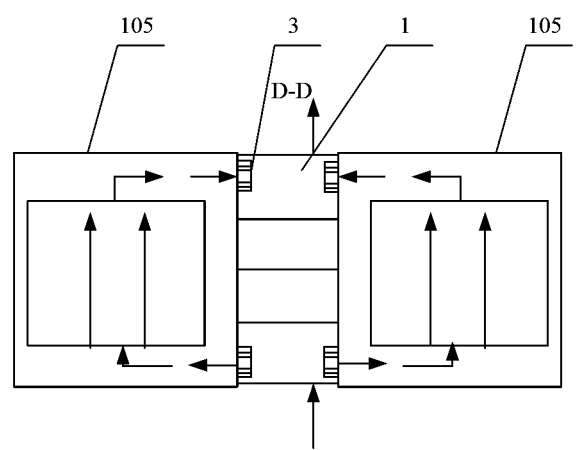
FIG. 8B is a schematic view illustrating the direction D-D in FIG. 8A.

FIG. 8A is a main view illustrating a ventilation denoising system provided by Embodiment 8 of the present disclosure, and FIG. 8B is a schematic view illustrating the direction D-D in FIG. 8A. As shown in FIGS. 8A and 8B, the system according to this embodiment includes two symmetrically disposed cabinets 105, between which is mounted a ventilation denoising device 205 of the structure shown in FIGS. 7A and 7B. The first ventilation opening and the second ventilation opening of the ventilating module in the ventilation denoising device 205 are respectively communicative with corresponding air inlets or air outlets of the two cabinets 105. The ventilation denoising device 205 in this embodiment can simultaneously serve as the air inlet and air outlet devices of the two cabinets, can reduce the noise generated during the running process of the cabinets by means of air ducts in each of the ventilating modules 1, and reduce the influences of the noise generated during the running process of the cabinets to the external environment.

In this embodiment, it is possible to perform ventilation and noise reduction for two cabinets 105 by disposing one ventilation denoising device between the two cabinets 105, whereby it is possible to effectively reduce the space occupied by the ventilation denoising device, and to effectively provide ventilation and noise reduction of the cabinets.

Embodiment 9

Figure 9:
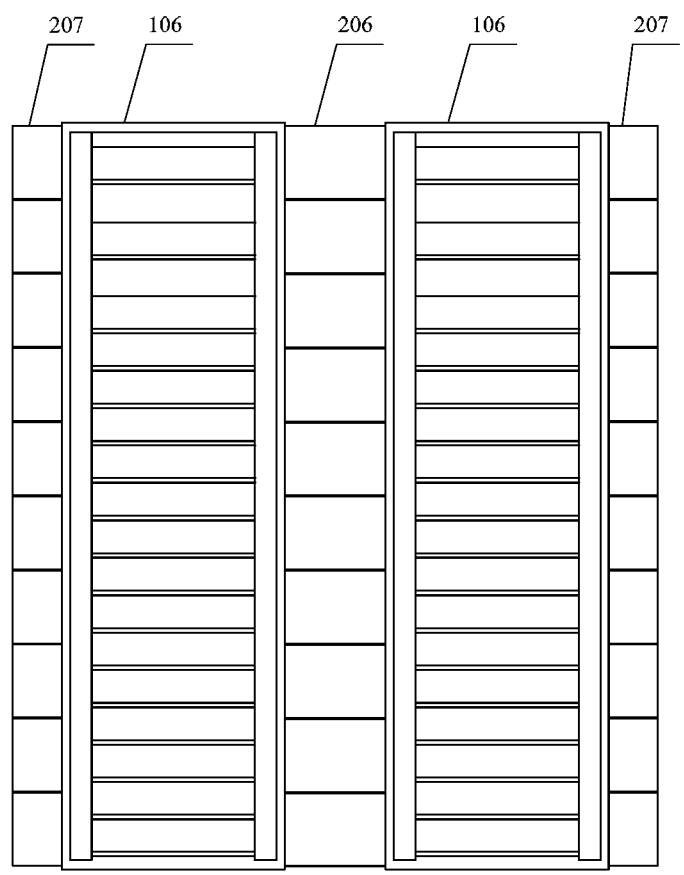
FIG. 9 is a main view illustrating a ventilation denoising system provided by Embodiment 9 of the present disclosure.

FIG. 9 is a main view illustrating a ventilation denoising system provided by Embodiment 9 of the present disclosure. Different from the cabinets in the embodiment shown in FIG. 8A, air inlets and air outlets are respectively disposed at both sides of two cabinets in this embodiment, between the two cabinets is disposed a ventilation denoising device 206 of the structure shown in FIGS. 7A and 7B, while at other sides of the two cabinets is disposed a ventilation denoising device 207 of the structure shown in FIG. 1A. As shown in FIG. 9, air inlets and air outlets are respectively disposed at both sides of the two cabinets 106, between the two cabinets 106 is disposed a ventilation denoising device 206, and at other sides of the cabinets 106 is disposed a ventilation denoising device 207, herein the ventilation denoising device 206 can serve as an air inlet device shared by the two cabinets 106, and the ventilation denoising device 207 serves as an air outlet device of the two cabinets 106. Alternatively, the ventilation denoising device 206 can also serve as an air outlet device shared by the two cabinets 106, and the ventilation denoising device 207 serves as an air inlet device of the two cabinets 106, to thereby provide the ventilation denoising requirements of the cabinets, and to meet the requirements of cabinets with greater demand for heat dissipation and noise reduction.

In this embodiment, by disposing a ventilation denoising device, which is communicative with ventilation openings of the two cabinets, between two cabinets and by disposing another ventilation denoising device at other sides of the cabinets, it is possible to effectively meet the cooling requirements of cabinets with demand for ventilation of air, to obtain better noise-reduction processing effects, and to reduce influences of the noise generated during the running process of the cabinets to the external environment.

In the aforementioned various embodiments of the present disclosure, the first ventilation opening and the third ventilation opening of the ventilating module of the ventilation denoising device are each provided with an air driving device 2 to accelerate circulation of air in the cabinet, to increase the speed at which external cold air enters the cabinet, and to increase the speed at which hot air inside the cabinet is expelled out of the cabinet. Thus, when the ventilation denoising device is installed, consideration may not be made as to whether the cabinet has been mounted with an air driving device, as the air driving devices are provided on the ventilating device to meet the requirement for ventilation of air in the cabinet.

The air driving device 2 may be such a device as a fan to drive the air to flow at accelerated speed towards a certain direction. Since the air driving device generates noise during operation, it is mounted at the first ventilation opening or the second ventilation opening communicative with a ventilation opening of the cabinet, so that the noise generated by the air driving device is absorbed by the air duct of the ventilating module during operation of the cabinet.

In the aforementioned various embodiments of the present disclosure, the air driving device may also not be disposed in the ventilating module of the ventilation denoising device, as it is possible to dispose the air driving device at the corresponding ventilation opening of the cabinet. Thus, it may not be considered to provide in the ventilating module the structure necessary for mounting the air driving device, and it may also not be considered to provide in the ventilating module the circuit for controlling the air driving device, as it suffices to mount the ventilation denoising device on the cabinet during use. While in use, it is possible to control the operation of the air driving device disposed on the cabinet via a control circuit disposed on the cabinet, and it is also possible to accelerate the speed of the air coming in/out of the cabinet, to provide the amount of air ventilated in the cabinet, and to meet the cooling requirement of the cabinet.

In the various embodiments of the present disclosure, the air driving device can also be disposed in the first ventilation opening or the third ventilation opening of partial ventilating modules of the ventilation denoising device, whereby while providing the speed of the air flowing in the cabinet and ensuring the amount of air to be ventilated for cooling the cabinet, it is possible to make use of relatively more ventilating modules to reduce the noise generated during the running process of the cabinet, and to maximally reduce the influences of the noise generated during the running process of the cabinet to the external environment. Concrete examples are taken below to make explanations.

Embodiment 10

Figure 10A:
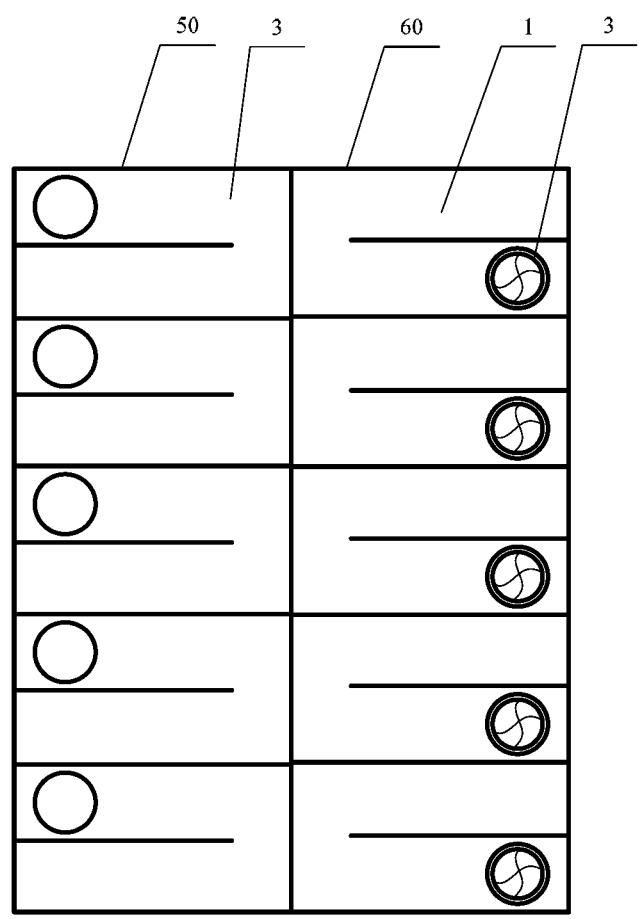
FIG. 10A is a main view illustrating a ventilation denoising device provided by Embodiment 10 of the present disclosure.
Figure 10B:
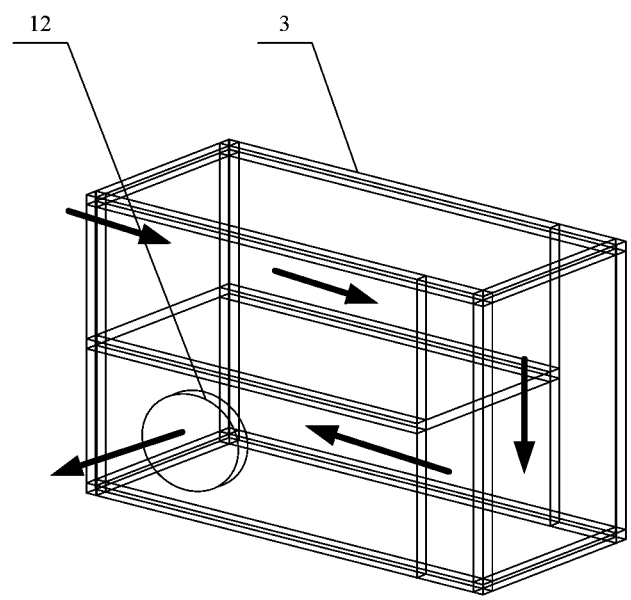
FIG. 10B is a schematic view exemplarily illustrating the structure of a ventilating module in the air inlet modular set in FIG. 10A.

FIG. 10A is a main view illustrating a ventilation denoising device provided by Embodiment 10 of the present disclosure, and FIG. 10B is a schematic view exemplarily illustrating the structure of a ventilating module in the air inlet modular set in FIG. 10A. Different from the embodiment as shown in FIG. 3A, the ventilating module of the air inlet modular set 50 in the ventilation denoising device according to this embodiment is the ventilating module 3 shown in FIG. 10B. As shown in FIGS. 10A and 10B, no air driving device is disposed in the first ventilation opening 12 of the ventilating module 3 of the air inlet modular set 50, whereas the air outlet modular set 60 still makes use of the ventilating module 1 shown in FIG. 1C, and an air driving device is disposed in the first ventilation opening of the ventilating module 1.

The ventilation denoising device according to this embodiment is applicable to cabinets with greater demand for noise reduction, and the demand for the amount of air to be ventilated in the cabinets can be satisfied merely by means of the air driving device disposed in the ventilating module 1 of the air outlet modular set 60, while the various ventilating modules of the air inlet modular set 50 and the air outlet modular set 60 can treat the noise generated during the running process of the cabinet, effectively reduce the noise generated during the running process of the cabinet, and reduce the influences of the noise generated during the running process of the cabinet to the external environment while providing the cabinet with sufficient amount of air that is ventilated.

Embodiment 11

Figure 11A:
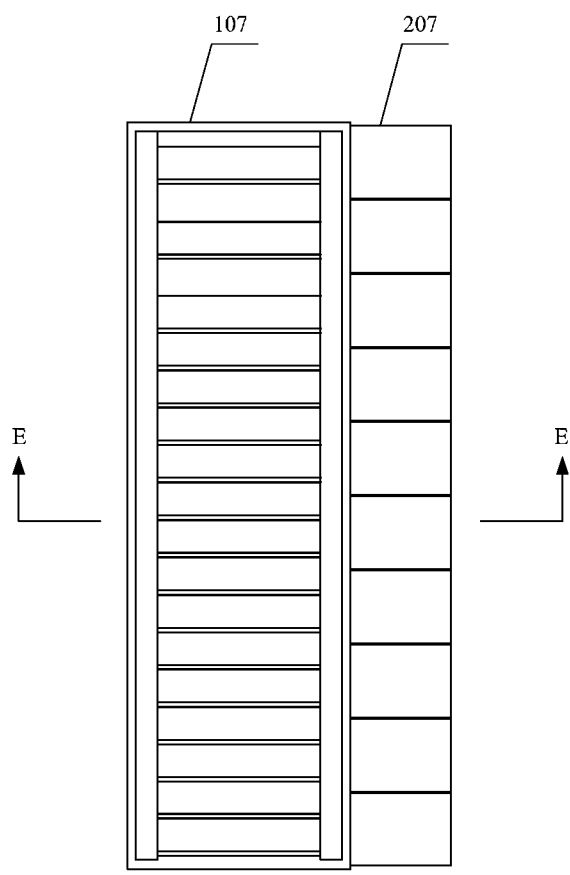
FIG. 11A is a main view illustrating a ventilation denoising system provided by Embodiment 11 of the present disclosure.
Figure 11B:
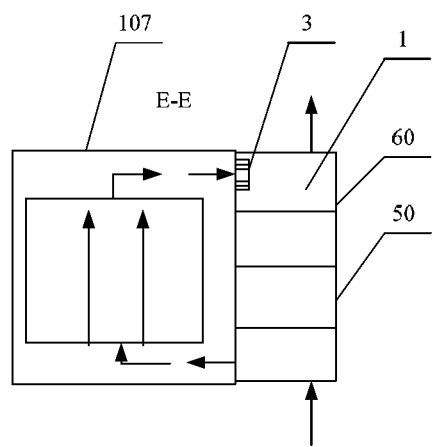
FIG. 11B is a schematic view illustrating the direction E-E in FIG. 11A.

FIG. 11A is a main view illustrating a ventilation denoising system provided by Embodiment 11 of the present disclosure, and FIG. 11B is a schematic view illustrating the direction E-E in FIG. 11A. In this embodiment, as shown in FIGS. 11A and 11B, on the same side of the cabinet 107 are disposed an air inlet and an air outlet as ventilation openings, at which is disposed a ventilation denoising device 207 of the structure shown in FIGS. 10A and 10B and including an air inlet modular set 50 and an air outlet modular set 60, herein no air driving device is disposed in the first ventilation openings of the ventilating module of the air inlet modular set 50, and an air driving device 3 is disposed in each of the first ventilation openings of the ventilating module of the air outlet modular set 60. Thus, under driving by the air driving device disposed in the air outlet modular set 60, the air is driven to flow inside the cabinet 107, and external cold air is forced to enter the cabinet via the second ventilation opening of the ventilating module of the air inlet modular set 50, so as to meet the ventilating requirement of the cabinet. At the same time, the noise generated during the running process of the cabinet can enter air ducts of the various ventilating modules of the air inlet modular set 50 and the air outlet modular set 60, and the various ventilating modules can all reduce the noise generated during the running process of the cabinet.

In this embodiment, the air driving device is disposed in the first ventilation openings of partial ventilating modules to satisfy the demand on the amount of inlet air needed to cool the cabinet, and it is possible to make use of relatively more ventilating modules to reduce the noise generated during the running process of the cabinet, and to effectively reduce the influences of the noise generated during the running process of the cabinet to the external environment.

In this embodiment, it is possible to provide the air driving device only in the ventilating module of the air inlet modular set, or to provide air driving devices in partial ventilating modules of the air inlet modular set and the air outlet modular set, as long as the air driving devices as provided can meet the requirement for the amount of air ventilated in the cabinet.

In this embodiment, the air driving device can also be disposed at partial air inlets or air outlets of the cabinet, whereby it is possible to reduce the influences of the noise generated during the running process of the cabinet to the external environment while satisfying the requirement on the amount of ventilated air needed for the operation of the cabinet.

In the aforementioned various device and system embodiments of the present disclosure, the ventilation denoising device can be installed with an air driving device or without any air driving device. The ventilation denoising device can be disposed in the ventilating module of the ventilation denoising device, as it is thus possible, when the air driving device is damaged, to directly repair the air driving device via the corresponding ventilating module or by directly taking out and repairing the corresponding ventilating module, thereby facilitating maintenance of the ventilation denoising system.

In the aforementioned various device embodiments of the present disclosure, the positions of the first ventilation and second ventilation openings of the ventilating module can be set according to the requirement of the cabinet to be ventilated and noise-reduced. Alternatively, the assembly of the various ventilating modules is arranged to adapt to the ventilating requirement of the cabinet, the position of the cabinet in the control room for example, to ensure that cold air and hot air can effectively circulate in the cabinet, and to ensure the cooling effect of the cabinet while reducing the noise of the cabinet.

In the aforementioned various system embodiments of the present disclosure, positions of the second ventilation openings of the various ventilating modules in the ventilation denoising device can be arranged according to the positions of the air inlet and the air outlet disposed at the cabinet, so that the second ventilation opening serving as the inlet of cold air and the second ventilation opening serving as the outlet of hot air can be located at different sides of the cabinet, to thereby prevent cold air and hot air from mixing with each other to lower the cooling effect of the cabinet.

In the various system embodiments of the present disclosure, proper air passages can be provided in the cabinet upon practical demand to cooperate with the ventilation denoising device mounted external to the cabinet, so as to make circulation of air smoother in the cabinet, to effectively carry out heat exchange for the heat generated inside the cabinet, and to enhance the heat dissipating effect of the cabinet.

The first ventilation opening, the second ventilation opening and the third ventilation opening in the ventilating module may be of such shapes as circular shape or square shape, and the air ducts in the ventilating module may be of circular shape or square shape, to which no particular restriction is made in the embodiments.

In the aforementioned various embodiments of the present disclosure, the arrangement and combination of the ventilating modules in the ventilation denoising device can be flexibly configured according to the requirements of the cabinet, as long as the ventilation denoising requirements of the cabinet can be satisfied.

The above embodiments are used merely to describe, rather than to restrict, the technical solutions of the present disclosure. Although the present disclosure is described in detail with reference to the above embodiments, it should be understood to persons ordinarily skilled in the art that it is still possible to modify certain technical solutions recorded in the above embodiments or to equivalently replace partial technical features thereof. Any such modification or replacement does not render the corresponding technical solutions to substantively depart from the spirits and scopes of the technical solutions of the various embodiments of the present disclosure.

What is claimed is:

1. A ventilation denoising device, comprising:
   at least one ventilating module that includes at least two air passages internal to the at least one ventilating module communicative end-to-end sequentially to form an air duct;
   wherein the at least one ventilating module further includes a first ventilation opening and a second ventilation opening and a third ventilation opening, of which the first ventilation opening is communicative with an end of the air duct, and the second ventilation opening is communicative with another end of the air duct, and the third ventilation opening is disposed symmetrically with respect to the first ventilation opening and on an opposite side of the air duct from the first ventilation opening, and the third ventilation opening is communicative with the same end of the air duct as the first ventilation opening; wherein the first ventilation opening and the third ventilation opening of the at least one ventilating module are respectively configured to be communicative with air inlets of two symmetrically disposed equipments.

2. The ventilation denoising device according to claim 1, wherein a number of the at least one ventilating modules is at least two, including an air inlet modular set and an air outlet modular set, wherein
   a first ventilation opening of a ventilating module in the air inlet modular set and a first ventilation opening in the air outlet modular set are disposed at the same side of the equipment, and respectively communicative with ventilation openings provided at the same side on the equipment; and
   a second ventilation opening of the ventilating module in the air inlet modular set is disposed at a first end of the ventilation denoising device, a second ventilation opening of the ventilating module in the air outlet modular set is disposed at a second end of the ventilation denoising device, and the second end of the ventilation denoising device is a different end from the first end of the ventilation denoising device.

3. The ventilation denoising device according to claim 1, wherein two ends of the air duct are disposed at the same end of the at least one ventilating module.

4. The ventilation denoising device according to claim 1, wherein the at least one ventilating module is a rectangular module having a cavity that includes a baffle plate for segmenting the cavity into the at least two air passages communicative end-to-end sequentially.

5. The ventilation denoising device according to claim 1, further comprising:
   a bracket for mounting the ventilation denoising device on an equipment;
   wherein the at least one ventilating module is mounted on the bracket.

6. The ventilation denoising device according to claim 5, wherein the ventilating module is detachably mounted on the bracket.

7. The ventilation denoising device according to claim 1, wherein an air driving device is provided at the first ventilation opening of the at least one ventilating module.

8. The ventilation denoising device according to claim 1, wherein a noise-reducing component is provided in the air duct of the at least one ventilating module.

9. A ventilation denoising system, comprising:
equipment to be ventilated and noise-reduced; and
a ventilation denoising device, comprising:
- at least one ventilating module that includes at least two air passages internal to the at least one ventilating module communicative end-to-end sequentially to form an air duct;
- wherein the at least one ventilating module includes a first ventilation opening and a second ventilation opening and a third ventilation opening, of which the first ventilation opening is communicative with an end of the air duct, and the second ventilation opening is communicative with another end of the air duct, and the third ventilation opening is disposed symmetrically with respect to the first ventilation opening and on an opposite side of the air duct from the first ventilation opening, and the third ventilation opening is communicative with the same end of the air duct as the first ventilation opening; and
- wherein the equipment includes ventilation openings, wherein the ventilation denoising device is mounted external to the ventilation openings of the equipment, and wherein the first ventilation opening and the third ventilation opening of the at least one ventilating module are respectively communicative with air inlets of two symmetrically disposed equipments.

10. The ventilation denoising system according to claim 9, wherein an air driving device is provided at the first ventilation opening of at least one ventilating module.

11. The ventilation denoising system according to claim 9, wherein the ventilation denoising device is mounted at one side of the equipment.

\* \* \* \* \*